(12) United States Patent
Fitz et al.

(10) Patent No.: US 7,700,387 B1
(45) Date of Patent: Apr. 20, 2010

(54) METHOD OF FABRICATING OPTICAL DEVICE USING MULTIPLE SACRIFICIAL SPACER LAYERS

(75) Inventors: John L. Fitz, Windsor Mill, MD (US); Daniel S. Hinkel, Sykesville, MD (US); Scott C. Horst, Sykesville, MD (US)

(73) Assignee: The United States of America as Represented by the Director, National Security Agency, Washington, DC (US)

( * ) Notice: Subject to any disclaimer, the term of this patent is extended or adjusted under 35 U.S.C. 154(b) by 0 days.

(21) Appl. No.: 12/454,023

(22) Filed: May 5, 2009

Related U.S. Application Data (62) Division of application No. 11/518,737, filed on Sep. 6, 2006.

(51) Int. Cl.
*H01L 21/8252* (2006.01)
*H01S 5/028* (2006.01)

(52) U.S. Cl. .................... 438/29; 438/22; 257/E21.085; 257/E21.539; 372/49.01

(58) Field of Classification Search .................. 438/29, 438/31, 32, 38, 702, 22; 372/49.01; 257/431, 257/E21.085, E21.539
See application file for complete search history.

(56) References Cited

U.S. PATENT DOCUMENTS

| | | | | |
|---|---|---|---|---|
| 5,010,039 A * | 4/1991 | Ku et al. | ...................... | 438/702 |
| 5,231,053 A * | 7/1993 | Bost et al. | .................... | 438/627 |
| 5,457,073 A * | 10/1995 | Ouellet | ........................ | 438/624 |
| 5,608,234 A * | 3/1997 | Jiang | ............................ | 257/94 |
| 5,661,083 A * | 8/1997 | Chen et al. | .................. | 438/637 |
| 5,721,155 A * | 2/1998 | Lee | ............................. | 438/637 |
| 6,022,782 A * | 2/2000 | Smith et al. | ................. | 438/303 |
| 6,330,378 B1 * | 12/2001 | Forrest et al. | ................. | 385/14 |
| 6,486,025 B1 | 11/2002 | Liu et al. | | |
| 6,835,581 B2 * | 12/2004 | Fitz et al. | ....................... | 438/22 |
| 6,936,839 B2 * | 8/2005 | Taylor | .......................... | 257/20 |
| 7,016,587 B2 * | 3/2006 | Kubby et al. | ................ | 385/129 |
| 7,184,455 B2 * | 2/2007 | Guenter et al. | ........... | 372/50.21 |
| 7,346,090 B2 * | 3/2008 | Johnson et al. | ........ | 372/50.124 |
| 7,442,577 B1 * | 10/2008 | Fitz et al. | ..................... | 438/106 |
| 7,457,487 B2 * | 11/2008 | Miller et al. | ................... | 385/2 |
| 2001/0035558 A1 * | 11/2001 | Smith et al. | ................. | 257/408 |
| 2007/0254393 A1 * | 11/2007 | Johnson | ....................... | 438/38 |

OTHER PUBLICATIONS

U.S. Appl. No. 09/412,682, filed Nov. 1, 2001, Smith et al.
Yuan,Y. et al.,"Edge-Emitting Lasers with Short-Period Semiconductor/Air Distributed Bragg Reflector Mirrors," IEEE Photonics Tech Letters, vol. 9, No. 7, pp. 881-883, Jul. 1997.

(Continued)

*Primary Examiner*—Mary Wilczewski
(74) *Attorney, Agent, or Firm*—Robert D. Morelli (57) ABSTRACT

The present invention is a method of fabricating an optical device using multiple sacrificial spacer layers. The first step in this process is to fabricate the underlying base structure and deposit an optical structure thereon. A facet is then created at the ends of the optical structure and alternating sacrificial and intermediate layers are fabricated on the device. A mask layer is deposited on the structure, with openings created in the layers to allow use of an etchant. User-defined portions of the spacer layers are subsequently removed with the etchant to create air gaps between the intermediate layers.

6 Claims, 3 Drawing Sheets

OTHER PUBLICATIONS

Hofling, E. et al.,"Edge-Emitting GaInAs-AlGaAs Microlasers," IEEE Photonics Technology vol. 11, No. 8, pp. 943-945, Aug. 1999.

Madhan,M. et al.,"Cont. Wave Operation of 1.55µm GAInAsP/InP Laser w/Semiconductors/Benzoclyclobutene Distr'd Bragg Reflector," Jap.Jnl of Appl.Phys. vol. 38 pp. L1240-L1242, Nov. 1999.

Hsu, W. et al.,"A Sub-Micron Capacitive Gap Process for Mult.-Metal-Electrode-Lateral Micromechanical Resonators," Tech. Digest,14th Int'l IEEE Micro Electro Mech Conf, Jan. 2001.

Rennon, S. et al., "12µm long edge-emitting quantum-dot laser," Electronics Letters, May 2001.

* cited by examiner

METHOD OF FABRICATING OPTICAL DEVICE USING MULTIPLE SACRIFICIAL SPACER LAYERS

CROSS-REFERENCE TO RELATED APPLICATION

The present invention is a division of U.S. patent application Ser. No. 11/518,737, entitled "METHOD OF FABRICATING OPTICAL DEVICE USING MULTIPLE SACRIFICIAL SPACER LAYERS," filed Sep. 6, 2006.

FIELD OF THE INVENTION

The present invention relates to semiconductor coherent light generators and, more specifically to semiconductor coherent light generators having an air gap.

BACKGROUND OF THE PRESENT INVENTION

Integration of semiconductor lasers to planar optical components, such as waveguides, semiconductor optical amplifiers (SOAs) and detectors, is important for photonic integrated circuit (PIC) applications. Lasers such as semiconductor ridge lasers are useful as elements of PICs because these lasers emit light horizontally, where light can be processed by another element that is formed on the horizontal plane of the substrate of the PIC. When working with these types of PICs it is essential to control reflections from the interfaces between the lasers and the integrated photonic components. With proper design, interface reflections may be used to enhance performance of integrated lasers.

One method is to precisely space gaps between components to coherently enhance or reduce reflections from the interfaces. To do this at least one air gap may be etched in a semiconductor' material near a facet. The air gap may be filled with a dielectric material to reduce diffraction losses. Prior art methods describe the use of resonant and anti-resonant etched gaps used to couple between lasers, SOAs and other lasers, taking advantage of the index discontinuity across air gaps to selectively enhance or reduce reflections across interfaces. A similar process has been demonstrated to create semiconductor lasers that make use of etched gaps in the semiconductor material to enhance reflectivity of the laser mirrors. At near-infrared (NIR) wavelengths, electron beam (e-beam) lithography is frequently required to provide the necessary resolution to define the etch masks used to create the resonant gaps.

A semiconductor Bragg reflector composed of air gaps and semiconductor layers may be etched to increase or decrease the reflectance of a facet. Etching a NIR, first order Bragg reflector requires an e-beam lithography machine that is expensive and slow. Optical lithography machines have sufficient resolution to define etched lasers to form a NIR high order Bragg reflector, but do not have sufficient resolution to define etched layers required to form a first order Bragg reflector and, therefore, cannot maximize optical reflection efficiency. An e-beam process is disclosed in a first article entitled "Edge-Emitting Lasers with Short-Period Semiconductor/Air Distributed Bragg Reflector Mirrors," by Y. Yuan et al., published in the *IEEE Photonics Technology Letters*, Vol. 9, No. 7, pp. 881-883, July 1997, a second article, entitled "Edge-Emitting GaInAs—AlGaAs Microlasers," by E. Hofling et al., published in *IEEE Photonics Technology*, Vo. 11, No. 8, pp. 943-945, August 1999, and a third article entitled "Continuous Wave Operation of 1.55 µm GaInAsP/InP Laser with Semiconductor/Benzocyclobutene Distributed Bragg Reflector," by Mothi Madhan et al., published in the *Japanese Journal of Applied Physics*, Vol. 38, pp. L1240-L1242, Nov. 1, 1999. The third article provides details on filling air gaps with a dielectric. These articles are hereby incorporated by reference into the specification of the present invention.

"A Sub-Micron Capacitive Gap Process for Multiple-Metal-Electrode Lateral Micromechanical Resonators," Wan That Hsu, et al, *Technical Digest*, $14^{th}$ International IEEE Micro Electro Mechanical Conference, January 2001, discloses a process for fabricating a semiconductor having gaps between metal electrodes and a polysilicon resonator resident on the semiconductor. With this method, a sacrificial spacer layer is deposited on a substrate. A polysilicon mechanical resonator is then deposited and etched over the sacrificial layer, during which time portions of the sacrificial layer are removed, and the metal electrodes are formed through electroplating on either side of the resonator. The sacrificial layer is ultimately removed in its entirety. The present invention does not operate in the same manner as this process. The Hsu article is hereby incorporated by reference into the present invention.

"12 µm long edge-emitting quantum-dot laser," S. Rennon, et al, *Electronics Letters*, May 2001, discloses a series of mirrors and a central waveguide. Each of the mirrors and the central waveguide are etched. First order Bragg mirrors are patterned by electron-beam lithography on the rear side of the waveguide with air gaps etched between the Bragg gratings. Third order mirrors are etched on the front side of the waveguide. The first order air gaps between Bragg mirrors decrease diffraction loss in the laser (compared to third order air gaps) produced by this method. The present invention is not fabricated in the same manner as the invention of Rennon, et al. Rennon, et al is hereby incorporated by reference into the specification of the present invention.

U.S. patent application Ser. No. 09/412,682, entitled "SACRIFICIAL SPACER FOR INTEGRATED CIRCUIT TRANSISTORS," discloses a semiconductor integrated circuit with a sacrificial sidewall. Specifically, temporary sidewalls are formed along the side of a gate electrode of a semiconductor. Source/drain regions are then formed on the semiconductor alongside the gate electrode, and the temporary sidewalls are removed, resulting in a space between the gate electrode and the source/drain regions. The present invention does not operate in this manner. U.S. patent application Ser. No. 09/412,682 is hereby incorporated by reference into the specification of the present invention.

U.S. Pat. No. 6,486,025, entitled "METHODS FOR FORMING MEMORY CELL STRUCTURES," discloses two methods for forming memory cell structures in a semiconductor integrated circuit. One method includes the use of a sacrificial spacer layer formed adjacent to the sidewall of a capacitor of a field effect transistor formed on the semiconductor device. A dielectric layer is then formed alongside the spacer layer, through which a bitline stud layer is formed that is electrically connected to the source/drain regions of the field effect transistor. The sacrificial spacer layer is finally removed from the structure. The present invention operates in a different manner from this process. U.S. Pat. No. 6,486,025 is hereby incorporated by reference into the specification of the present invention.

The methods described above effectively create air gaps in semiconductor structures, however the processes are extremely inefficient as applied to optical devices. Typically several masking and etching steps are required to create both the components, such as waveguides, and the air gaps in optical devices. This can be both time-consuming and costly. What is desirable in the art is to create an efficient, inexpensive method of creating optical semiconductor devices with integrated air gaps to alter mirror reflectance.

SUMMARY OF THE INVENTION

It is an object of the present invention to provide a method of fabricating a laser using sacrificial spacer layers.

It is a further object of the present invention to provide a method of fabricating a laser using a sacrificial spacer layer, wherein multiple sacrificial spacer layers operate to create air gaps and a sacrificial spacer layer adheres the structure comprising the laser to the photonic device.

It is another object of the present invention to provide a method of fabricating a laser using sacrificial spacer layers, wherein multiple single sacrificial spacer layers operate to create air gaps and a sacrificial spacer layer adheres the structure comprising the laser to the photonic device and wherein a wet etch is used to remove the sacrificial spacer layers.

The present invention is a method of fabricating a laser with buried resonant gaps using sacrificial spacer layers. The first step of the method is selecting a base structure.

The second step of the method is forming an optical structure on the base structure.

The third step is forming a lateral electron and photon confinement region in the optical structure.

The fourth step of the method is depositing a metal contact on at least one end of the optical structure.

The fifth step of the method is creating an optical feedback surface.

The sixth step of the method is depositing a first sacrificial spacer.

The seventh step of the method is depositing an intermediate layer on the sacrificial spacer layer.

The eighth step of the method is returning to the sixth step if additional sacrificial spacer layers are desired, otherwise proceeding to the ninth step.

The ninth step of the method is depositing a mask layer on the layers deposited in steps six through eight.

The tenth step of the method is defining openings in the mask layer.

The eleventh step of the method is etching holes through user-definable portions of the intermediate layers and sacrificial spacer layers beneath the openings in the mask layer:

The twelfth step of the method is removing a user-definable portion of each sacrificial spacer layer.

DETAILED DESCRIPTION OF THE PREFERRED EMBODIMENT

Figure 1:
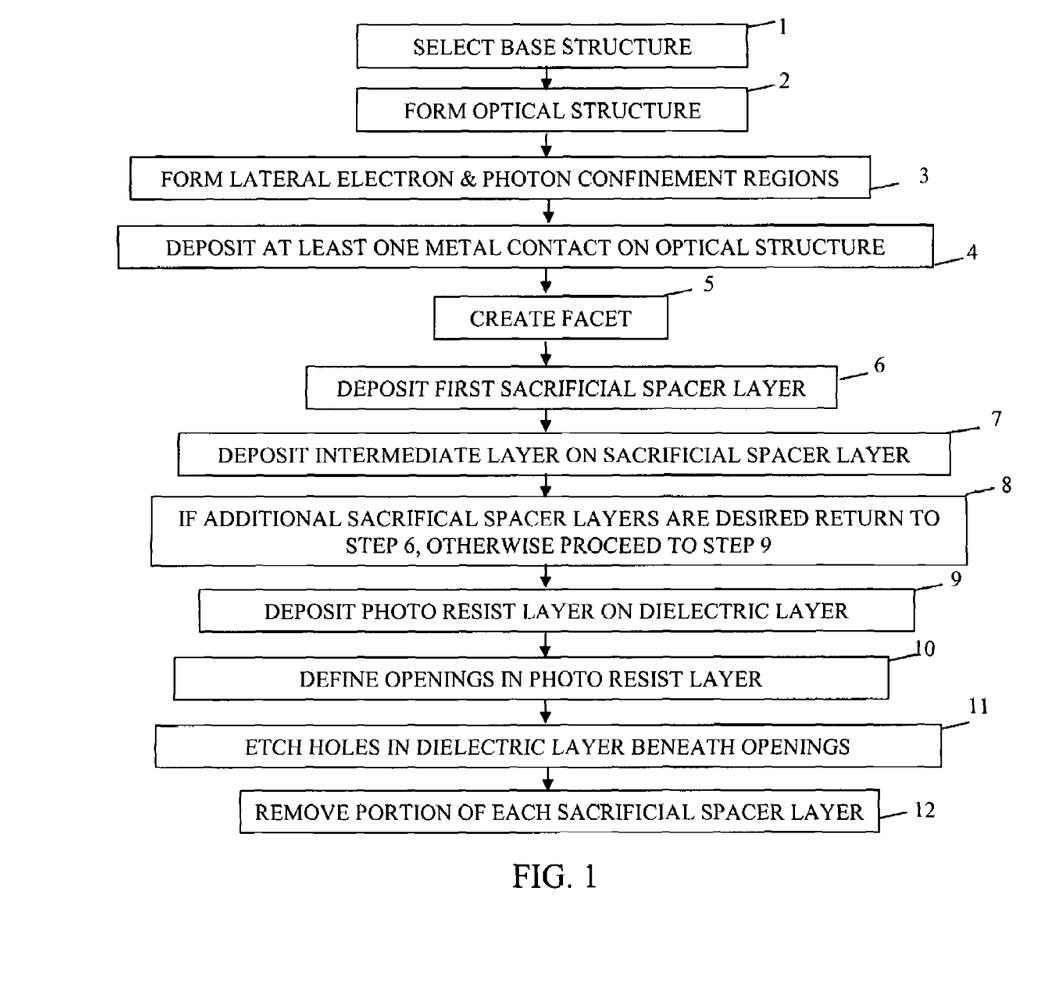
FIG. 1 is a flow chart of the steps of the present invention.

The present invention is a method of fabricating a photonic device using a sacrificial spacer layer. FIG. 1 shows the steps of an exemplary embodiment of the method of the present invention. The present invention can operate using any optical structure or other coherent photonic emitter structure, however it will be described with respect to a specific optical structure. It will be understood by those of skill in the art that the method may operate with any other suitable structure, such as a standard bipolar, p-i-n semiconductor laser.

The first step 1 of the method is selecting a base structure. The base structure, for example a substrate, is composed of a compound semiconductor material and forms the base of the optical device fabricated according to the method of the present invention. In the preferred embodiment, the base structure is an n-type substrate, however the base structure may also be a p-type or undoped substrate according to user preferences. Many such base structures are commercially available, or can be readily produced. The base structure may be of any size, but preferably is approximately 3 inches in diameter.

The second step 2 of the present invention is forming an optical structure on the base structure. In the preferred embodiment the optical structure is a semiconductor laser, however any other suitable optical structure may be used. In a further preferred embodiment the optical structure is composed of InGaAs. An optical structure is preferably a structure capable of being combined with mirrors (or facets) to create a laser using known techniques, however may be any other suitable structure for creating an optical device or coherent photonic emitter device. The optical structure may be deposited through any conventional method, many of which are well known and commonly used in the art, such as growing, depositing, and/or etching the optical structure on the base structure. As is obvious to those of skill in the art, the steps above may include additional processing steps, such as polishing, etching, or grinding, to further refine the surfaces of each layer. Every such step is anticipated by this invention and may be used as desired by those skilled in the art. As was discussed, processing may be performed to create semiconductor lasers of specific geometries required for photonic device applications.

The third step 3 of the method is forming a coherent photonic emitter device on the optical structure. In the preferred embodiment, the coherent photonic emitter device includes at least one active layer in which photon emission may be stimulated. The photonic emitter device may be formed by any suitable method. The photonic emitter device formed on the substrate may include a P—N junction of direct gap semiconductors, a PIN structure with direct gap semiconductor quantum wells, a graded index structure with direct gap semiconductor quantum wells, Er doped glass layers, or any other suitable structure. The photonic emitter device may be in the form of a ridge, a buried heterostructure, a polygonal mesa, a ring, a Y-structure, or any other suitable form. As is known in the art, a coherent photonic emitter device includes lateral electron and photon confinement regions. In the preferred embodiment these regions are formed at the time of forming the photonic emitter device. Such regions can be formed by any conventional method, such as producing trenches along the edges of the photonic emitter device. Other methods of forming the confinement regions will depend on the structure of the photonic emitter and the materials used.

The fourth step 4 of the present invention is depositing at least one metal contact on the photonic emitter device. In the preferred embodiment a metal contact is preferably deposited on the photonic emitter device such that it is in contact with the entire photonic emitter device. The metal may be deposited through any conventional method, such as electron beam evaporation or thermal evaporation. The metal of the contact is composed of an Ohmic material compatible with the material of the optical structure, and therefore will vary depending on the photonic emitter device structure as would be obvious to those of skill in the art. Typical Ohmic materials used for the metal contact include titanium platinum gold, chromium gold, and gold tin gold.

The fifth step 5 of the method is creating an optical feedback surface (or facet). A facet may be created by cleaving through the base structure and optical structures at a user definable location. Facets may also be created using an anisotropic etch process such as reactive ion etching, inductively coupled plasma etching, wet chemical etch, or any other method as is well known to those skilled in the art. In the preferred embodiment the photonic emitter structure is of a rectangular structure, and the facets are created at each end of the rectangular structure. If the photonic emitter structure is of another shape, a facet is preferably created at the end of each branch of the photonic emitter structure. As an example, in a substantially Y-shaped optical structure, three facets are preferably created, one being created at the end of each of the three branches of the Y-shaped optical structure.

The sixth step 6 of the method is depositing a first sacrificial spacer layer along the facet surfaces and a user-definable portion of the optical structure and coherent photonic emitter device. As was explained in greater detail above, a facet is preferably created at each end of photonic emitter structure. According to the sixth step 6, the sacrificial spacer layer entirely covers each facet and further covers a user-definable portion of the optical structure. The sacrificial spacer layer is preferably composed of a dielectric oxide material. In a further embodiment the sacrificial spacer layer is composed of $SiO_2$. The sacrificial spacer layer is of a user definable thickness, but in a preferred embodiment optimized for laser facets, is approximately 236.25 nm on the vertical surfaces. The sacrificial spacer layer can be deposited on the structure by any conventional means, but is preferably deposited using a conformal process.

The seventh step 7 of the method is depositing an intermediate layer on the sacrificial spacer layer. The intermediate layer is preferably composed of a dielectric nitride material. In a further embodiment the sacrificial spacer layer is composed of $Si_3N_4$. The intermediate layer is of a user definable thickness and refractive index, but in a preferred embodiment is approximately 118 nm on the vertical surfaces with a refractive index of 2.0. The intermediate layer can be deposited on the structure by any conventional means, but is preferably deposited using a conformal process.

The eighth step 8 of the method is returning to the sixth step 6 if additional sacrificial spacer layers are desired, otherwise proceeding to the ninth step 9. In an alternative embodiment of the invention, multiple sacrificial spacer layers are used. In this embodiment the result is multiple air gaps being created in the resultant optical device. If the user desires multiple air gaps to be created in the device, the method returns to the sixth step 6. If a single air gap is desired, the method proceeds to the ninth step 9.

The ninth step 9 of the method is depositing a mask layer on the sacrificial spacer layers and intermediate layers deposited in the sixth step 6, seventh step 7 and eighth step 8 above. In the preferred embodiment the mask layer is a photoresist layer, however in an alternative embodiment, any other form of masking layer can be used in place of the photoresist. Such masking layers include traditional hard mask and other mechanical masks. The mask layer is deposited through known techniques over the entire photonic device. Such techniques include spin coating or soft baking the photoresist on the dielectric layer. Many materials are available that may be used as suitable photoresist, and any such material that is compatible with the dielectric layer may be used. In the preferred embodiment the entire photonic device is covered, however less than the entire photonic device may be covered according to user-preferences. The mask layer must cover the photonic device in the areas along at least a portion of the edge of each facet approximately in the location required for buried gaps.

The tenth step 10 of the method is defining openings in the mask layer beside the facets. Defining openings in the mask layer is performed through any conventional technique. The openings should be oriented such that if the sacrificial and intermediate layers were etched directly below the openings access would be provided to each sacrificial spacer layer. Therefore, the openings in the mask layer must be aligned to the locations that require structures with at least one gap. The openings may be of any user-definable shape and dimensions, however in the preferred embodiment the openings are substantially square and approximately 100 microns in width.

The eleventh step 11 of the method is etching openings in the sacrificial spacer and intermediate layers beneath the openings in the mask layer. Etching may be performed through any conventional method, such as a plasma etch process. The openings in the sacrificial spacer and intermediate layers are preferably etched such that the openings are substantially the same shape and dimensions as the openings created in the mask layer in the tenth step 10 of the method. The openings in the dielectric layer are etched to a sufficient depth to allow access to a user-definable number of sacrificial spacer layers deposited in the sixth step 6 of the method.

The twelfth step 12 of the method is removing a user-definable portion of each sacrificial spacer layer. The sacrificial spacer layer can be removed by any conventional means, however in the preferred embodiment it is removed by a timed wet etch wherein the wet etchant is deposited through the openings made in the mask layer and the sacrificial and intermediate layers. The timed etched is preferably performed with buffered hydrofluoric acid. This creates gaps between the facet and intermediate layer and between each of the respective intermediate layers if multiple sacrificial spacer layers are used.

In an alternative embodiment, the mask layer is removed. The mask layer may be removed through any conventional method, such as removing the mask layer using a chemical solvent. As is obvious to those of skill in the art, the method of removal of the mask layer will depend on the specific mask layer material used in conjunction with the invention.

Figure 2:
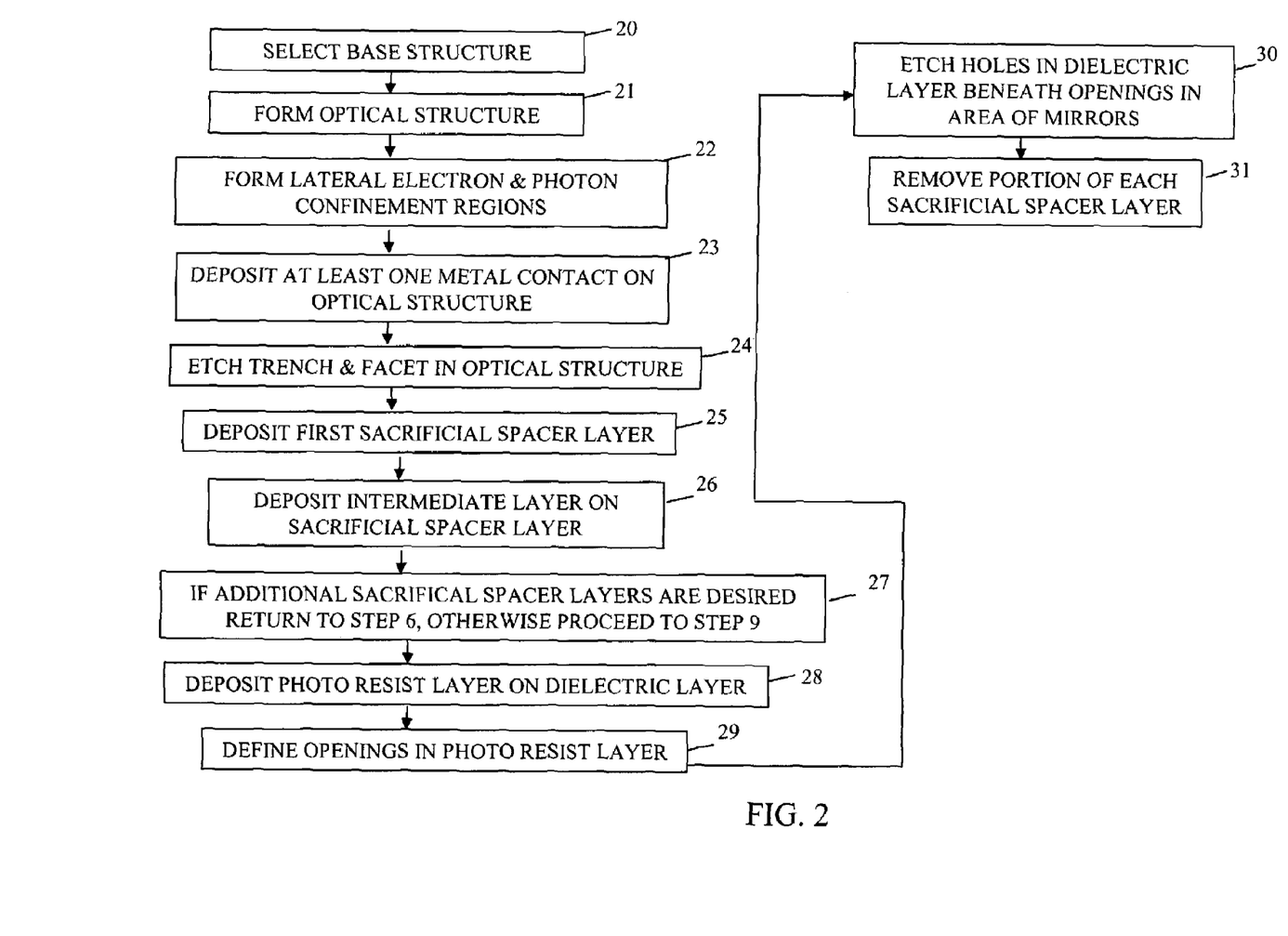
FIG. 2 is a flow chart of the steps of a first alternative embodiment of the present invention.

The steps of a method of a first alternative embodiment are shown in FIG. 2. The first step 20 of the first alternative method of FIG. 2 is selecting a base structure. This step is essentially identical to the first step 1 of the method of FIG. 1, and therefore will not be discussed in detail. As with the first step 1 of FIG. 1, the base structure in the preferred embodiment is a compound semiconductor.

The second step 21 of the first alternative embodiment is forming an optical structure on the base structure. As with the second step 2 of FIG. 1, the optical structure in the preferred embodiment of the optical structure is a semiconductor laser, however any other suitable optical structure may be used. This step is essentially identical to the second step 2 of the method of FIG. 1, and therefore will not be discussed in detail.

The third step 22 of the first alternative embodiment is forming a coherent photonic emitter device on the optical structure. In the preferred embodiment, the coherent photonic emitter device includes at least one active layer in which photon emission may be stimulated. The photonic emitter device may be formed by any suitable method. The photonic emitter device formed on the substrate may include a P—N junction of direct gap semiconductors, a PIN structure with direct gap semiconductor quantum wells, a graded index structure with direct gap semiconductor quantum wells, Er doped glass layers, or any other suitable structure. The photonic emitter device may be in the form of a ridge, a buried hetero structure, a polygonal mesa, a ring, a Y-structure, or any other suitable form. As is known in the art, a coherent photonic emitter device includes lateral electron and photon confinement regions. In the preferred embodiment these regions are formed at the time of forming the photonic emitter device. Such regions can be formed by any conventional method, such as producing trenches along the edges of the photonic emitter device. Other methods of forming the confinement regions will depend on the structure of the photonic emitter and the materials used.

The fourth step 23 of the first alternative embodiment is depositing at least one metal contact on the photonic emitter device. In the preferred embodiment a metal contact is preferably deposited on the photonic emitter device such that it is in contact with the entire photonic emitter device except at the edges where a trench will be formed as described in detail with respect to the fifth step 24 of the alternative embodiment. The remainder of the fourth step 23 is essentially identical to the fourth step 4 of the method of FIG. 1, and therefore will not be discussed in detail.

The fifth step 24 of the method of FIG. 2 is creating an optical feedback surface (or facet). In the first alternative embodiment, a facet and output trench may be created simultaneously by etching at least one trench and facet into the base structure, wherein the at least one metal contact acts as an etch mask for the facets of photonic emitter structure. A facet formed by this process is one end of a trench. Manners of etching facets are well known and commonly used in the art and any conventional method could be used in conjunction with the present invention. For example, the shape of the metal contact may cover the area of the laser that will require current injection. This area is the entire area of the photonic emitter structure, including the area that will form the facets. A photoresist will be patterned such that it protects all surfaces of the semiconductor where etching is not required. A photoresist is not present where etching will occur and facets will be formed. The etching will occur at the edges of the optical structure where a trench is formed. During etching, all other portions of the device are protected by the photoresist. The photoresist opening is overlapped with the edges of the metal contact where the facets will be formed such that the contact is exposed to the etch along its respective edges. In the exemplified embodiment, the photonic emitter structure is etched anisotropically to form vertical sidewalls, but may be etched by any other suitable means as would be obvious to those of skill in the art. As was discussed above, any material not covered by photoresist is etched during this process. However, since the edges of the metal contact are not covered by a photoresist at the edges where the facets are etched, it is the contact that protects the semiconductor and allows facets to be formed only along the edges of the metal contact. In this manner the contacts actually act as an etch mask to protect the photonic emitter structure region covered by the contact. The facets are formed between the edges of each contact and any area not protected by photoresist. The trench region is also defined during the fifth step 24 used for creation of etched facets. In the preferred embodiment a trench is etched at each end of a rectangular photonic emitter structure. If the photonic emitter structure is of another shape, a trench is preferably etched at the end of each branch of the photonic emitter structure. As an example, in a substantially Y-shaped optical structure, three trenches are preferably etched, one being etched at the end of each of the three branches of the Y-shaped optical structure. A trench is a substantially U-shaped region created in an optical device for a number of purposes. First, the trench is necessary for proper performance of the device, as the trench must first be created prior to creation of some components of the device. Second, in some optical devices the trench can be used to house additional components, such as waveguides. The trench can be etched in the structure by any conventional method, but in the preferred embodiment a chlorine-based plasma etch is used. In a further preferred embodiment the structure is etched using $BCl_3/Cl_2$. The goal is to etch through the optical structure to a depth that provides maximum transmission of the optical signal generated by the photonic emitter device. The width of the trench is user definable, but in the preferred embodiment is approximately 8 μm.

The sixth step 25 is depositing a first sacrificial spacer layer along the horizontal and vertical trench surfaces and a user-definable portion of the optical structure. This step is essentially identical to the sixth step 6 of the method of FIG. 1, and therefore will not be discussed in detail.

The seventh step 26 of the first alternative embodiment is depositing an intermediate layer on the sacrificial spacer layer. This step is essentially identical to the seventh step 7 of the method of FIG. 1, and therefore will not be discussed in detail. The intermediate layer can be deposited on the structure by any conventional means, but is preferably deposited using a conformal process.

The eighth step 27 is returning to the sixth step 25 if additional sacrificial spacer layers are desired, otherwise proceeding to the ninth step 28. This step is essentially identical to the eighth step 8 of the method of FIG. 1, and therefore will not be discussed in detail.

The ninth step 28 is depositing a mask layer on the sacrificial spacer layers and intermediate layers deposited in the sixth step 25, seventh step 26 and eighth step 27 above. This step is essentially identical to the ninth step 9 of the method of FIG. 1, and therefore will not be discussed in detail.

The tenth step 29 of the first alternative embodiment is defining openings in the mask layer beside the facets adjacent to the end of the trenches created during the fifth step 24. Defining openings in the mask layer is performed through any conventional technique. The openings should be oriented such that if the sacrificial and intermediate layers were etched directly below the openings access would be provided to each sacrificial spacer layer. Therefore, the openings in the mask layer must be aligned to the locations that require structures with at least one gap. The openings may be of any user-definable shape and dimensions, however in the preferred embodiment the openings are substantially square and approximately 5 microns in width.

The eleventh step 30 is etching holes in the sacrificial spacer and intermediate layers beneath the openings in the mask layer. Etching may performed through any conventional method, such as a plasma etch process. The openings in the sacrificial spacer and intermediate layers are preferably etched such that the openings are substantially the same shape and dimensions as the openings created in the mask layer in the tenth step 29 above. The openings in the dielectric layer are etched to a sufficient depth to allow access to a user-definable number of sacrificial spacer layers deposited in the sixth step 25 of the method.

The twelfth step 31 is removing a user-definable portion of each sacrificial spacer layer. This creates gaps between the facet and intermediate layer and between each of the respective intermediate layers if multiple sacrificial spacer layers are used. This step is essentially identical to the twelfth step 12 of the method of FIG. 1, and therefore will not be discussed in detail.

Figure 3:
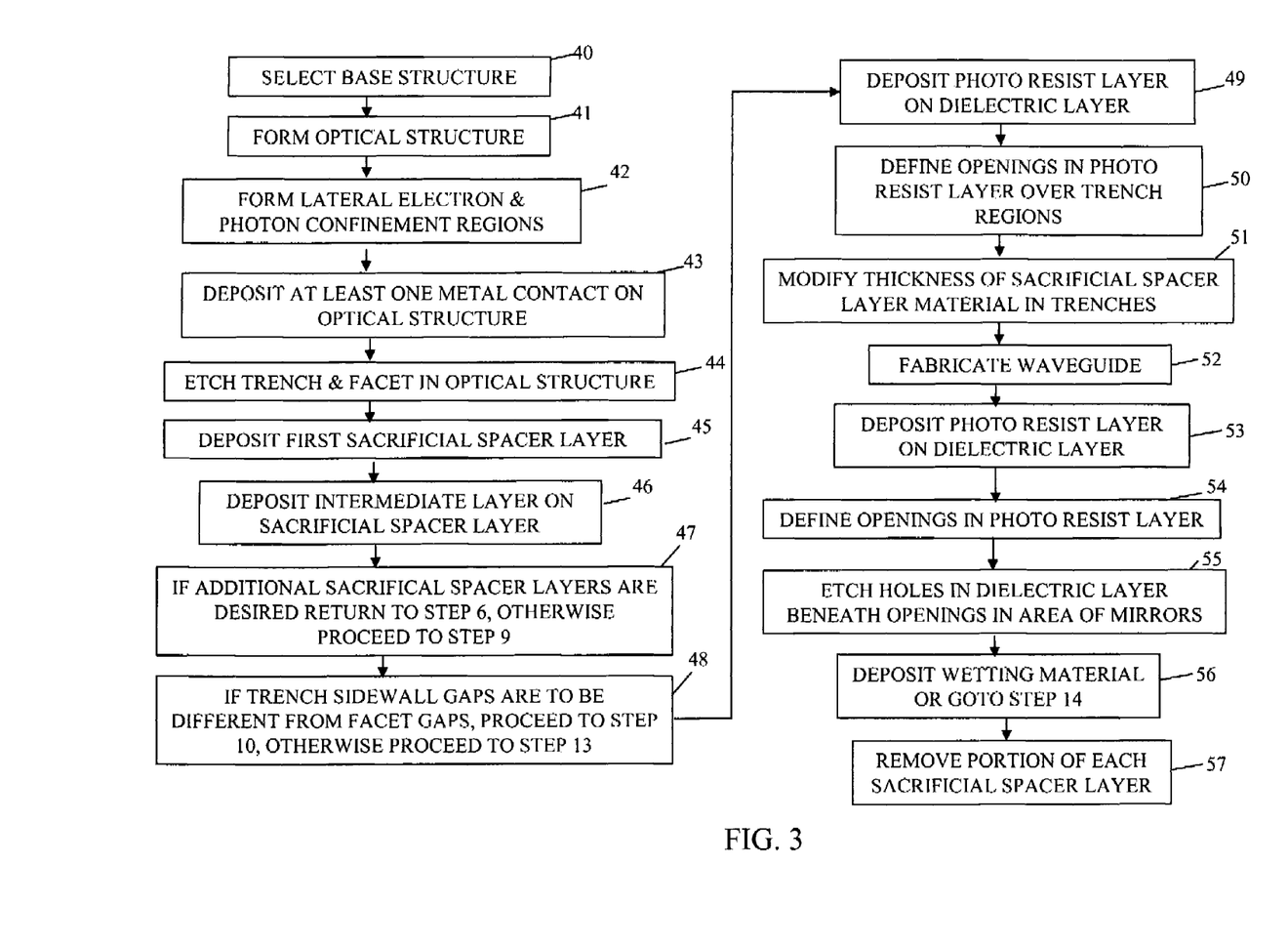
FIG. 3 is a flow chart of the steps of a second alternative embodiment of the present invention.

The steps of a method of a second alternative embodiment are shown in FIG. 3. The first step 40 of the second alternative method of FIG. 3 is selecting a base structure. This step is essentially identical to the first step 1 of the method of FIG. 1, and therefore will not be discussed in detail. As with the first step 1 of FIG. 1, the base structure in the preferred embodiment is a compound semiconductor.

The second step 41 of the second alternative embodiment is forming an optical structure on the base structure. As with the second step 2 of FIG. 1, the optical structure in the preferred embodiment of the optical structure is a semiconductor laser, however any other suitable optical structure may be used. This step is essentially identical to the second step 2 of the method of FIG. 1, and therefore will not be discussed in detail.

The third step 42 of the second alternative embodiment is forming a coherent photonic emitter device on the optical structure. In the preferred embodiment, the coherent photonic emitter device includes at least one active layer in which photon emission may be stimulated. This step is essentially identical to the third step 22 of the first alternative embodiment of FIG. 2, and therefore will not be described in detail.

The fourth step 43 of the second alternative embodiment of FIG. 3 is depositing at least one metal contact on the photonic emitter device. In the preferred embodiment a metal contact is preferably deposited on the photonic emitter device such that it is in contact with the entire photonic emitter device except at the edges where a trench will be formed as described in detail with respect to the fifth step 44 of the second alternative embodiment. The remainder of step 43 is essentially identical to the fourth step 4 of the method of FIG. 1, and therefore will not be discussed in detail.

The fifth step 44 is creating an optical feedback surface (or facet). In the second alternative embodiment, a facet and output trench may be created simultaneously by etching at least one trench and facet into the base structure, wherein the at least one metal contact acts as an etch mask for the facets of photonic emitter structure. This step is essentially identical to the fifth step 24 of the first alternative embodiment of FIG. 2, and therefore will not be discussed in detail.

The sixth step 45 is depositing a first sacrificial spacer layer along the horizontal and vertical trench surfaces and a user-definable portion of the optical structure. This step is essentially identical to the sixth step 6 of the method of FIG. 1, and therefore will not be discussed in detail.

The seventh step 46 of the first alternative embodiment is depositing an intermediate layer on the sacrificial spacer layer. This step is essentially identical to the seventh step 7 of the method of FIG. 1, and therefore will not be discussed in detail. The intermediate layer can be deposited on the structure by any conventional means, but is preferably deposited using a conformal process.

The eighth step 47 is returning to the sixth step 45 if additional sacrificial spacer layers are desired, otherwise proceeding to the ninth step 28. This step is essentially identical to the eighth step 8 of the method of FIG. 1, and therefore will not be discussed in detail.

The ninth step 48 is proceeding to the thirteenth step 52 if the gaps are to be the same dimensions on the facets and trench sidewalls created in the fifth step 44 above, otherwise proceeding to the tenth step 49 if the trench sidewall gaps are to be different from the facet gaps.

The tenth step 49 of the method is depositing a mask layer on the sacrificial spacer layers and intermediate layers deposited in the sixth step 45, seventh step 46 and eighth step 47 above. This step is essentially identical to the ninth step 9 of the method of FIG. 1, and therefore will not be discussed in detail.

The eleventh step 50 of the second alternative embodiment is defining openings in the mask layer over the trenches created during the fifth step 44. Defining openings in the mask layer is performed through any conventional technique. The openings may be of any user-definable shape and dimensions, however in the preferred embodiment the openings are substantially square and approximately 8 microns wider than the trench structures created during the fifth step 44.

The twelfth step 51 is modifying the thickness (based on user definable requirements) of the sacrificial spacer layers and intermediate layers that were deposited into the trenches in the sixth step 45, seventh step 46, and eighth step 47 above using the mask layer. Trenches created on the fifth step 44 may contain waveguides fabricated during the thirteenth step 52 below. Vertical alignment of those waveguides between optical components may require the removal of the dielectric sacrificial spacer layers and intermediate layers that were deposited into the trenches in the sixth step 45, seventh step 46, and eighth step 47. The mask created with the eleventh step 50 above is used to etch a user definable portion of those dielectric layers off of the trench surfaces. The mask layer is subsequently used to deposit a trench sacrificial layer optimized for waveguide sidewall gaps, where the thickness of the trench sacrificial layer differs from the sacrificial spacer layers deposited on the laser facets during the sixth step 45. Etching and deposition processes using mask layers are well known in the art, and any such process may be used in conjunction with the present invention, such as the use of conventional hard masks, photoresists, or other masking techniques according to user preferences. As is obvious to those of skill in the art, the etchant will depend on the type of mask used. In a preferred embodiment, a fluorine-based plasma is used to etch a user definable portion of the sacrificial spacer layers and intermediate layers that were deposited into the trenches in the sixth step 45, seventh step 46, and eighth step 47. A low temperature plasma-enhanced-chemical-vapor-deposition process is then used to deposit a trench sacrificial layer that will be selectively removed in the eighteenth step 57 to create a gap between the waveguide fabricated on the thirteenth step 52 and the trench created on the fifth step 44. If waveguides fabricated during the thirteenth step 52 below do not require etching of previous sacrificial spacer layers and intermediate layers that were deposited into the trenches in the sixth step 45, seventh step 46, and eighth step 47, then the mask layer created with the eleventh step 50 may be used to deposit a sacrificial layer optimized for waveguide sidewall gaps, where the thickness of the trench sacrificial layer differs from the sacrificial spacer layers deposited on the laser facets during the sixth step 45. This step then provides a waveguide sidewall sacrificial spacer layer that is optimized for waveguide performance and is independent of the thickness of the sacrificial spacer layer thickness optimized for laser facets. The mask layer created with the eleventh step 50 is removed prior to the thirteenth step 52.

The thirteenth step 52 of the method is fabricating a waveguide on the sacrificial spacer layers and intermediate layers that were deposited into the trenches in the sixth step 45, seventh step 46, and eighth step 47 and may have been modified in the twelfth step 51 above. In the preferred embodiment, the waveguide material fills the remaining portion of the trench, however the waveguide may fill less than the entire trench according to user preferences. Any suitable material can be used for the waveguide, however in the preferred embodiment a polymer material is used, such as benzocyclobutene (BCB.) Any suitable method can be used to deposit the waveguide on the sacrificial spacer layer, such as spin coating the waveguide material on the sacrificial spacer layer. Excess waveguide material may exist after deposition of the waveguide, such as material that has been deposited on the upper contact or that rises above the level of the trench. In a preferred embodiment, if any excess material exists after deposition of the waveguide, it is removed through a plasma etch process such as reactive ion etching (RIE.) This RIE may be performed using appropriate plasmas, such as a fluorine-based plasma. The removal of the excess guide material exposes the sacrificial spacer layer material near the regions where gaps are required. This then allows a wet chemical access to the sacrificial spacer layer material so that the sacrificial spacer layer can be selectively removed.

The fourteenth step 53 is depositing a second mask layer on the sacrificial spacer layers and intermediate layers deposited in the sixth step 45, seventh step 46 and eighth step 47 above. This step is essentially identical to the ninth step 9 of the method of FIG. 1, and therefore will not be discussed in detail.

The fifteenth step 54 of the second alternative embodiment is defining openings in the second mask layer beside the facets adjacent to the end of the trenches created during the fifth step 44. Defining openings in the second mask layer is performed through any conventional technique. The openings should be oriented such that if the sacrificial and intermediate layers were etched directly below the openings access would be provided to each sacrificial spacer layer. Therefore, the openings in the second mask layer must be aligned to the locations that require structures with at least one gap. The openings may be of any user-definable shape and dimensions, however in the preferred embodiment the openings are substantially square and approximately 5 microns in width.

The sixteenth step 55 is etching holes in the sacrificial spacer and intermediate layers beneath the openings in the second mask layer. Etching may performed through any conventional method, such as a plasma etch process. The openings in the sacrificial spacer and intermediate layers are preferably etched such that the openings are substantially the same shape and dimensions as the openings created in the second mask layer in the fifteenth step 54 above. The openings in the dielectric layer are etched to a sufficient depth to allow access to a user-definable number of sacrificial spacer layers deposited in the sixth step 45 of the method.

The seventeenth step 56 is depositing a user definable wetting material if required by the geometries of the etch openings and the materials used for the sacrificial layers and the etch materials. The wetting material increases capillary action between a wet etchant and the interior surfaces of the holes etched in the sixteenth step 55 above. The wetting material thereby provides for direct chemical contact between the etchant used in the eighteenth step 57 below and the sacrificial layers exposed in the sixteenth step 55 above. In the preferred embodiment, the wetting material is silicon dioxide. The wetting material must be etched in the same etchant used in the eighteenth step 57 below.

The eighteenth step 57 is removing a user-definable portion of each sacrificial spacer layer. The sacrificial spacer layer can be removed by any conventional means, however in the preferred embodiment it is removed by a timed wet etch wherein the wet etchant is deposited through the openings made in the second mask layer and the sacrificial and intermediate layers. To optimize chemical contact of the etchant to the sacrificial layers, the surface tension of the etchant can be reduced by use of any means as are well known in the art. An additional method to reduce surface tension is through exposure of the sample to ultrasonic energy while the sample is immersed in the etchant. This may be done with or without a wetting material. The timed etched is preferably performed with buffered hydrofluoric acid. This creates gaps between the facet and intermediate layer and between each of the respective intermediate layers if multiple sacrificial spacer layers are used. The sacrificial spacer layer may additionally be removed from a user-definable portion of the base of the trench, however a sufficient amount of the sacrificial spacer layer must remain to adhere the waveguide to the base of the trench.

The result of the above described process is an optical semiconductor device consisting of a laser with an integral optical structure, such as a waveguide, with multiple air gaps. The air gaps exist along trenches disposed at each end of the optical structure and at the facet of the optical structure. This process is less time consuming and more cost efficient than previous methods for creating air gaps in optical semiconductor devices as a single step is required for the creation of the sacrificial spacer layer and the adhesion layer for the waveguide. Removal of the sacrificial spacer layer also occurs in a single step. Additionally, a single step is used for creation of gaps that reduce losses in the optical structure. Because simple processes are used to achieve each step, the method of the present invention creates significant advantages over the prior art inventions.

What is claimed is:

1. A method for creating a photonic device comprising the steps of:
    a) selecting a base structure;
    b) forming an optical structure on the base structure;
    c) forming a coherent photonic emitter device on the optical structure;
    d) depositing at least one metal contact on the photonic emitter device;
    e) creating at least one facet having a first surface on the coherent photonic emitter structure, optical structure and base structure, wherein the facet and an output trench are created simultaneously by etching at least one trench and facet into the base structure;
    f) depositing a first sacrificial spacer layer along the horizontal and vertical trench surfaces and a user-definable portion of the optical structure;
    g) depositing an intermediate layer on the sacrificial spacer layer;
    h) returning to steps (f) and (g) if additional sacrificial spacer layers are desired, otherwise proceeding to step (i);
    i) depositing a mask layer over the sacrificial spacer layers and intermediate layers deposited in steps (f), (g) and (h);
    j) defining openings in the mask layer beside the facets adjacent to each end of a trench;
    k) etching holes in the sacrificial spacer and intermediate layers beneath the openings in the mask layer; and
    l) removing a user-definable portion of each sacrificial spacer layer.

2. The method of claim 1, further including the step of removing a user-definable portion of the mask layer.

3. The method of claim 2, wherein the step of creating at least one facet having a first surface on the coherent photonic emitter structure, optical structure and base structure, wherein the facet and an output trench are created simultaneously by etching at least one trench and facet into the base structure further comprises creating at least one facet having a first surface on the coherent photonic emitter structure, optical structure and base structure, wherein the facet and an output trench are created simultaneously by etching at least one trench and facet into the base structure, and further wherein the at least one metal contact acts as an etch mask for the facets of photonic emitter structure.

4. The method of claim 3, wherein the step of creating at least one facet having a first surface on the coherent photonic emitter structure, optical structure and base structure, wherein the facet and an output trench are created simultaneously by etching at least one trench and facet into the base structure, and further wherein the at least one metal contact acts as an etch mask for the facets of photonic emitter structure further comprises the steps of:

a) patterning a photoresist on the photonic device such that it defines openings at the edges of the optical structure where a trench is formed, the openings overlapping with the edges of the metal contact where the facets will be formed such that the contact is exposed to the etch along its respective edges; and b) etching the photonic device through the photoresist to create the at least one facet and trench, wherein the mask layer acts as an etch mask to protect the photonic device.

5. The method of step 4, wherein the mask layer is a photoresist.

6. The method of step 5, wherein the optical device is a semiconductor laser.

* * * * *